United States Patent
Nakayama et al.

(10) Patent No.: US 9,985,108 B2
(45) Date of Patent: May 29, 2018

(54) SEMICONDUCTOR DEVICE AND METHOD FOR MANUFACTURING SEMICONDUCTOR DEVICE INCLUDING AL ELECTRODE FORMED ON ALXGA(1-X)N LAYER

(71) Applicant: Renesas Electronics Corporation, Kawasaki-shi (JP)

(72) Inventors: Tatsuo Nakayama, Kawasaki (JP);
Masaaki Kanazawa, Kawasaki (JP);
Yasuhiro Okamoto, Kawasaki (JP);
Takashi Inoue, Kawasaki (JP);
Hironobu Miyamoto, Kawasaki (JP);
Ryohei Nega, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 80 days.

(21) Appl. No.: 14/330,995

(22) Filed: Jul. 14, 2014

(65) Prior Publication Data
US 2015/0041821 A1   Feb. 12, 2015

(30) Foreign Application Priority Data
Aug. 9, 2013   (JP) .................................. 2013-166315

(51) Int. Cl.
*H01L 29/739* (2006.01)
*H01L 29/66* (2006.01)
(Continued)

(52) U.S. Cl.
CPC .. *H01L 29/66462* (2013.01); *H01L 29/42368* (2013.01); *H01L 29/452* (2013.01);
(Continued)

(58) Field of Classification Search
CPC ... H01L 29/78; H01L 29/452; H01L 29/2003; H01L 29/66462; H01L 29/42316; H01L 29/7783; H01L 29/7786
(Continued)

(56) References Cited

U.S. PATENT DOCUMENTS 7,554,132 B2   6/2009   Kosaki et al.
7,981,744 B2   7/2011   Kosaki et al.
(Continued)

FOREIGN PATENT DOCUMENTS

JP   2000-31540 A   1/2000
JP   2003-86825 A   3/2003
(Continued)

OTHER PUBLICATIONS

Japanese Office Action dated Sep. 13, 2016 with English translation thereof.
(Continued)

*Primary Examiner* — Hung Vu
(74) *Attorney, Agent, or Firm* — McGinn IP Law Group, PLLC.

(57) ABSTRACT

An electrode comes in ohmic contact with an AlGaN layer. A semiconductor device SD has a nitride semiconductor layer GN2, and an $Al_xGa_{(1-x)}N$ layer AGN (hereinafter referred to as "AlGaN layer AGN), and Al electrodes DE, SE. in the AlGaN layer AGN, $0<x\leq 0.2$ is satisfied. Also, both of a concentration of a p-type impurity and a concentration of an n-type impurity in the AlGaN layer AGN are $1\times 10^{16}$ cm$^{-3}$ or lower. In this example, the p-type impurity is exemplified by, for example, Be, C, and Mg, and the n-type impurity is exemplified by Si, S, and Se. Also, the Al electrodes DE and SE are connected to the AlGaN layer AGN. Because a composition ratio of Al is limited to the
(Continued)

above-mentioned range, the Al electrodes DE and SE are brought into ohmic contact with the AlGaN layer AGN.

16 Claims, 7 Drawing Sheets

(51) Int. Cl.
*H01L 29/78* (2006.01)
*H01L 29/45* (2006.01)
*H01L 29/778* (2006.01)
*H01L 29/20* (2006.01)
*H01L 29/423* (2006.01)

(52) U.S. Cl.
CPC .... *H01L 29/66522* (2013.01); *H01L 29/7786* (2013.01); *H01L 29/78* (2013.01); *H01L 29/2003* (2013.01); *H01L 29/4236* (2013.01)

(58) Field of Classification Search
USPC ............................ 257/76, 183, 190, 192, 194
See application file for complete search history.

(56) References Cited

U.S. PATENT DOCUMENTS

| 7,985,984 | B2* | 7/2011 | Nakayama et al. | .......... 257/190 |
| 8,525,274 | B2 | 9/2013 | Takada | |
| 2013/0105811 | A1* | 5/2013 | Ando | ...................... H01L 29/78 |
| | | | | 257/76 |
| 2014/0110759 | A1* | 4/2014 | Murata | ............... H01L 29/7783 |
| | | | | 257/194 |

FOREIGN PATENT DOCUMENTS

| JP | 2005-353817 A | | 12/2005 |
| JP | 2007-123824 A | | 5/2007 |
| JP | 2010-278333 A | | 12/2010 |
| JP | 2011-151176 A | | 8/2011 |
| JP | 2012-044003 A | | 3/2012 |
| WO | WO2013005372 | * | 1/2013 |

OTHER PUBLICATIONS

Japanese Office Action dated Feb. 7, 2017 with English translation thereof.

* cited by examiner

SEMICONDUCTOR DEVICE AND METHOD FOR MANUFACTURING SEMICONDUCTOR DEVICE INCLUDING AL ELECTRODE FORMED ON ALXGA(1-X)N LAYER

CROSS-REFERENCE TO RELATED APPLICATIONS

The disclosure of Japanese Patent Application No. 2013-166315 filed on Aug. 9, 2013 including the specification, drawings and abstract is incorporated herein by reference in its entirety.

BACKGROUND

The present invention relates to a semiconductor device, and a method for manufacturing the semiconductor device, and for example, a technique that can be applied to a semiconductor device having an AlGaN layer, and a method for manufacturing the semiconductor device.

One of compound semiconductor devices uses a GaN-based semiconductor layer. When an electrode is connected to the GaN-based semiconductor device, it may be preferable that the connection between the electrode and the GaN-based semiconductor device is performed by ohmic contact. The technique for connecting the electrode to the GaN-based semiconductor device is disclosed in, for example, Japanese Unexamined Patent Application Publication No. 2000-31540, Japanese Unexamined Patent Application Publication No. 2003-86825, and Japanese Unexamined Patent Application Publication No. 2005-353817.

Japanese Unexamined Patent Application Publication No. 2000-31540 discloses that an Al electrode is connected to an i-layer formed of a GaN layer. Japanese Unexamined Patent Application Publication No. 2000-31540 discloses that a p-type impurity is added to an AlGaN layer (Al may not be eliminated) as an example of a method for forming the i-layer. Also, Japanese Unexamined Patent Application Publication No. 2000-31540 discloses that an Al electrode is connected to the GaN layer added with a high concentration of n-type impurity.

Japanese Unexamined Patent Application Publication No. 2003-86825 discloses that a high carrier layer is formed to bring the GaN layer into ohmic contact with the electrode. An electrode material is exemplified by Al/Ti, Au/Ti, Ti, and Al.

Japanese Unexamined Patent Application Publication No. 2005-353817 discloses that an electrode is brought into ohmic contact with a non-doped $Al_{0.25}Ga_{0.75}N$ layer. This electrode has a structure in which Ti and Al are stacked in the stated order.

SUMMARY

When manufacturing costs of the semiconductor device having the compound semiconductor are reduced, it is preferable to divert a manufacturing process of the semiconductor device using a silicon substrate. Under the circumstances, the present inventors have studied a method of bringing the electrode made of Al into ohmic contact with the AlGaN layer. The other problems and novel features will become apparent from the description of the present specification, and the attached drawings.

According to one embodiment, an Al electrode is formed on an $Al_xGa_{(1-x)}N$ layer (0<x≤0.2). The concentrations of a p-type impurity and an n-type impurity contained in the $Al_xGa_{(1-x)}N$ layer are $1\times10^{16}$ $cm^{-3}$ or lower.

According to the one embodiment, the Al electrode can be brought into ohmic-contact with the AlGaN layer.

DETAILED DESCRIPTION

Hereinafter, embodiments will be described with reference to the drawings. In all of the drawings, the same components are denoted by identical symbols, and their description will be appropriately omitted.

Figure 1:
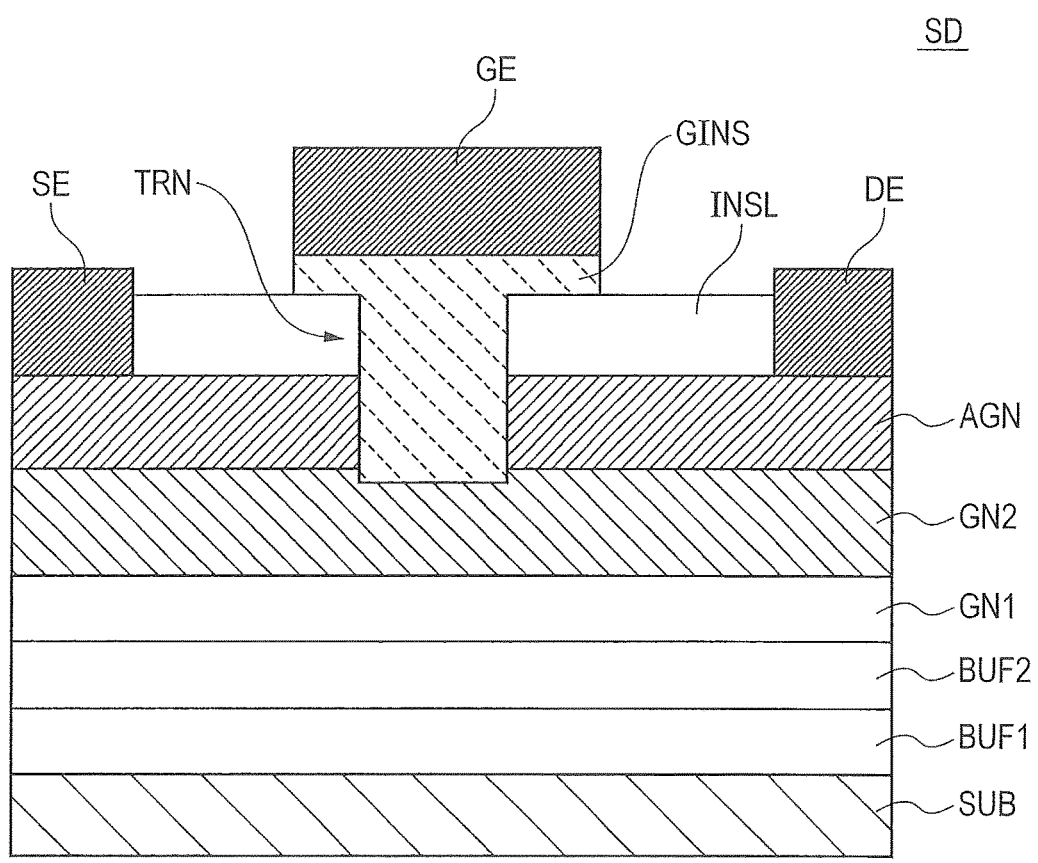
FIG. 1 is a cross-sectional view illustrating an exemplary configuration of semiconductor device according to an embodiment.

FIG. 1 is a cross-sectional view illustrating an exemplary configuration of semiconductor device SD according to an embodiment. FIG. 1 is a conceptual view, and therefore dimensional ratios of respective members are not limited to an example illustrated in FIG. 1.

A semiconductor device SD includes a nitride semiconductor layer GN2, an $Al_xGa_{(1-x)}N$ layer AGN (hereinafter referred to as "AlGaN layer AGN"), and Al electrodes DE, SE. In the AlGaN layer AGN, 0<x≤0.2 is satisfied. Also, the concentration of a p-type impurity and the concentration of an n-type impurity in the AlGaN layer AGN are each $1\times10^{16}$ $cm^{-3}$ or lower. In this example, the p-type impurity is exemplified by, for example, Be, C, and Mg, and the n-type impurity is exemplified by Si, S, and Se. Also, the Al electrodes DE and SE are connected to the AlGaN layer AGN. Because a composition ratio of Al is limited to the above-mentioned range, the Al electrodes DE and SE are brought into ohmic contact with the AlGaN layer AGN. The details will be described below.

In this embodiment, the semiconductor device SD has a transistor. The nitride semiconductor layer GN2 is a channel layer, and the AlGaN layer AGN is an electron supply layer. The Al electrode DE is a drain electrode, and the Al electrode SE is a source electrode. The AlGaN layer AGN comes in contact with a gate insulating film GINS. A material of the gate insulating film GINS is, for example, at least one of SiN, $SiO_2$, SiON, SiOC, $Al_2O_3$, $HfO_2$, and $ZrO_2$. It is preferable that the gate insulating film GINS is particularly $Al_2O_3$. A thickness of the gate insulating film GINS is, for example, equal to or larger than 20 nm, and equal to or smaller than 80 nm.

Also, a gate electrode GE is formed on the gate insulating film GINS. The gate electrode GE is, for example, a polysilicon layer or a polycrystal silicon layer. In this case, the gate electrode GE may be doped with, for example, an impurity of B or As. Also, the gate electrode GE may be formed of a metal layer. In this case, a material of the gate electrode GE is, for example, at least one of Ti, Al, and Ni, or a Si compound or an N compound of at least one of those materials.

The nitride semiconductor layer GN2 is made of a material larger in electron affinity than the AlGaN layer AGN. For that reason, a two dimensional electron gas is generated in an area of the nitride semiconductor layer GN2 which is located in the vicinity of an interface with the AlGaN layer AGN. A transistor of the semiconductor device SD has the two-dimensional electron gas as carrier. In this example, when the AlGaN layer AGN is of a multilayered structure, the electron affinity of at least one layer must be smaller than the electron affinity of the nitride semiconductor layer GN2.

The nitride semiconductor layer GN2 may be, for example, a GaN layer, an AlGaN layer, or an InAlN layer. Also, impurity may be contained in the nitride semiconductor layer GN2, or may not be contained therein. In this example, the p-type impurity is exemplified by Be, C, and Mg, and the n-type impurity is exemplified by Si, S, and Se. When the impurity is contained in the nitride semiconductor layer GN2, it is preferable that the impurity concentration of the nitride semiconductor layer GN2 is $1 \times 10^{17}$ cm$^{-3}$ or lower. The reason is because if the impurity concentration of the nitride semiconductor layer GN2 is high, carrier (two dimensional electron gas) in the nitride semiconductor layer GN2 is scattered (Coulomb scattered) by the impurity. If the Coulomb scattering is generated, the mobility of carrier (two-dimensional electron gas) is lowered, and a sheet resistance of the nitride semiconductor layer GN2 becomes larger.

The content (the above-mentioned x) of Al in the AlGaN layer AGN is $0<x\leq0.2$. Since the carrier (two dimensional electron gas) concentration becomes lower if the content (the above-mentioned x) of Al in the AlGaN layer AGN is lower, it is preferable that $0.1\leq x$ is satisfied. The thickness of the AlGaN layer AGN is, for example, equal to or larger than 20 nm, and equal to or smaller than 50 nm.

Also, it is preferable that the p-type impurity is not added to the AlGaN layer AGN. Further, it is preferable that the n-type impurity is not added to the AlGaN layer AGN. In the present specification, that the impurity is not added to the AlGaN layer AGN means that the concentration of impurity is lower than a measurement limit in an analysis method.

In the example illustrated in FIG. 1, a recess TRN is formed in the AlGaN layer AGN. The recess TRN penetrates through the AlGaN layer AGN, and a bottom of the recess TRN is inserted into the nitride semiconductor layer GN2. A distance from an interface between the nitride semiconductor layer GN2 and the AlGaN layer AGN to the bottom of the recess TRN is, for example, equal to or larger than 2 nm, and equal to or smaller than 10 nm. In the transistor provided in the semiconductor device SD illustrated in FIG. 1, the above-mentioned two-dimensional electron gas is divided by the recess TRN. For that reason, this transistor is of a normally-off type. However, the transistor provided in the semiconductor device SD is not limited to the above-mentioned structure. For example, the semiconductor device SD may be a normally-on transistor. In the example illustrated in FIG. 1, the gate insulating film GINS is embedded in the recess TRN. Alternatively, the gate insulating film GINS may be formed along a bottom surface and a side surface of the recess TRN. In this case, the remaining space of the recess TRN is filled with the gate electrode GE.

Also, the semiconductor device SD is formed of a substrate SUB made of, for example, silicon. In detail, a first buffer layer BUF1, a second buffer layer BUF2, and an underlayer GN1 are formed on the substrate SUB. The first buffer layer BUF1 is a core formation layer made of AlN, and the second buffer layer BUF2 is a layer in which AlN layers and GaN layers are alternately repetitively stacked on each other. At least one of the first buffer layer BUF1 and the second buffer layer BUF2 may be omitted depending on the type of the substrate SUB.

Also, the underlayer GN1 is a layer forming a base of the nitride semiconductor layer GN2. The underlayer GN1 may be a GaN layer, an AlGaN layer, or an InAlN layer. A boundary between the underlayer GN1 and the nitride semiconductor layer GN2 may be unclear because a composition ratio can be gradually changed. Also, for the same reason, a boundary between the nitride semiconductor layer GN2 and the AlGaN layer AGN may be unclear.

Also, each of the Al electrode DE and the Al electrode SE is formed of a single layer of an Al layer. Alternatively, another metal layer may be provided on the Al layer. Also, the Al layer may contain at least one kind of Si, Ca, and Cu as an additive element. A thickness of the Al electrodes DE and SE is, for example, equal to or larger than 200 nm, and equal to or smaller than 600 nm.

An insulating layer INSL is formed on an area of the AlGaN layer AGN in which the Al electrodes DE and SE are not formed. The insulating layer INSL is disposed for protecting the AlGaN layer AGN. In the example illustrated in FIG. 1, the recess TRN penetrates through the insulating layer INSL and the AlGaN layer AGN. The gate insulating film GINS and the gate electrode GE are formed on the insulating layer INSL. The insulating layer INSL may be formed of a single-layer film, or a multilayer film. A material of the insulating layer INSL is required to be larger in band gap than an outermost layer of the AlGaN layer AGN, and smaller in electron affinity than the outermost layer of the AlGaN layer AGN. The insulating layer INSL is made of, for example, at least one of SiN, $SiO_2$, SiON, SiOC, $Al_2O_3$, $HfO_2$, and $ZrO_2$. It is preferable that in order to suppress a current collapse, the insulating layer INSL is made of a material low in the density of an interface state formed in an interface between the insulating layer INSL and the AlGaN layer AGN.

Subsequently, an exemplary method for manufacturing the semiconductor device SD will be described with reference to FIGS. 2 to 4. A timing at which the Al electrodes DE and SE are formed is not limited to an example illustrated in FIGS. 2 to 4.

Figure 2:
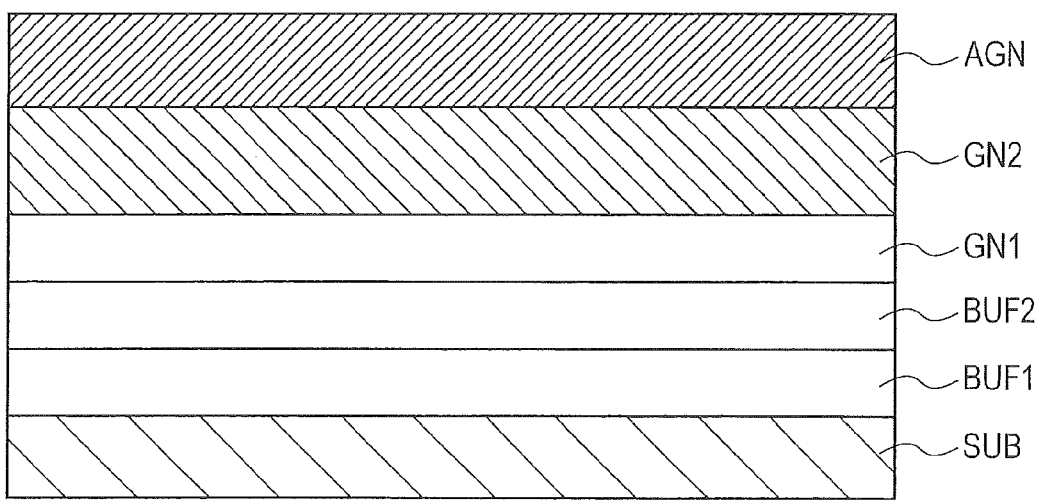
FIG. 2 is a diagram illustrating an exemplary method for manufacturing the semiconductor device.

First, as illustrated in FIG. 2, a configuration in which the first buffer layer BUF1, the second buffer layer BUF2, and the underlayer GN1 are stacked on the substrate SUB is prepared. Then, the nitride semiconductor layer GN2 is formed on the underlayer GN1, and the AlGaN layer AGN is further formed on the nitride semiconductor layer GN2.

Figure 3:
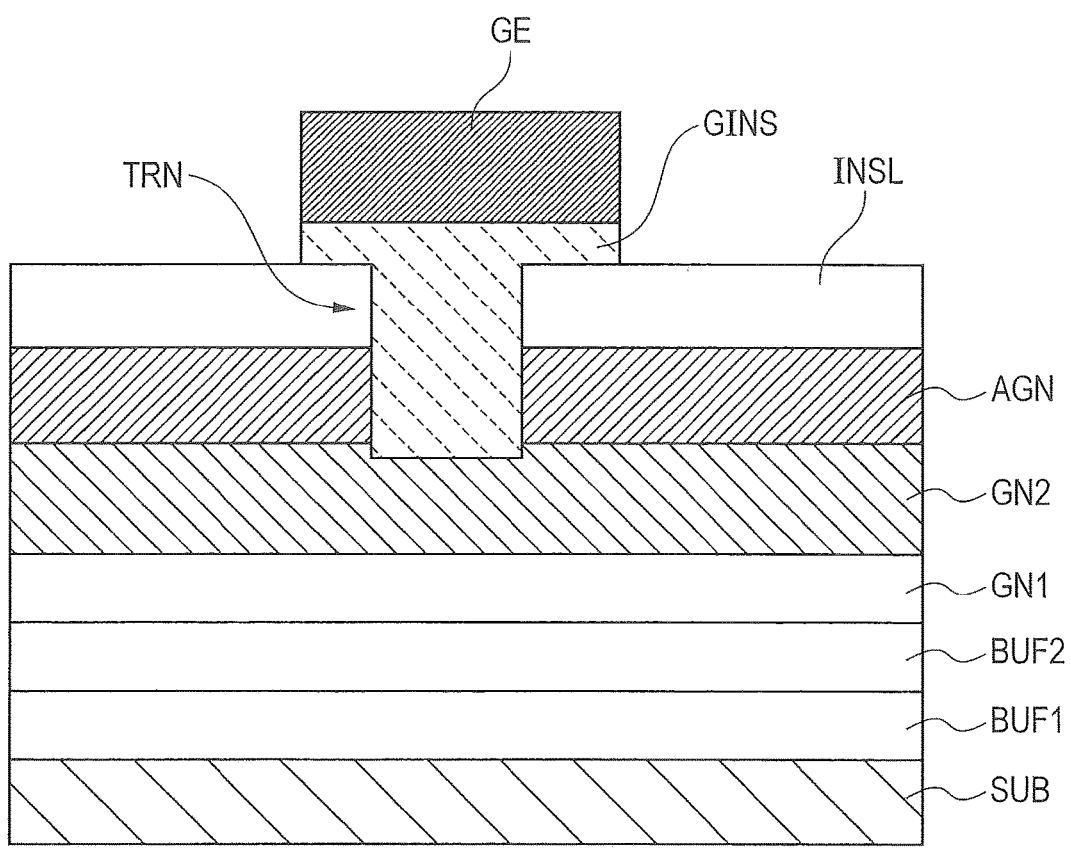
FIG. 3 is a diagram illustrating the exemplary method for manufacturing the semiconductor device.

Then, as illustrated in FIG. 3, the insulating layer INSL is formed on the AlGaN layer AGN, and the recess TRN is formed in the insulating layer INSL and the AlGaN layer AGN. Then, an insulating film functioning as the gate insulating film GINS is formed within the recess TRN, and a conductive layer functioning as the gate electrode GE is formed on the insulating film. Then, a resist pattern (not shown) is formed on the conductive layer, and the conductive layer and the insulating film are etched. With the above process, the gate insulating film GINS and the gate electrode GE are formed. Thereafter, the resist pattern is removed.

Figure 4:
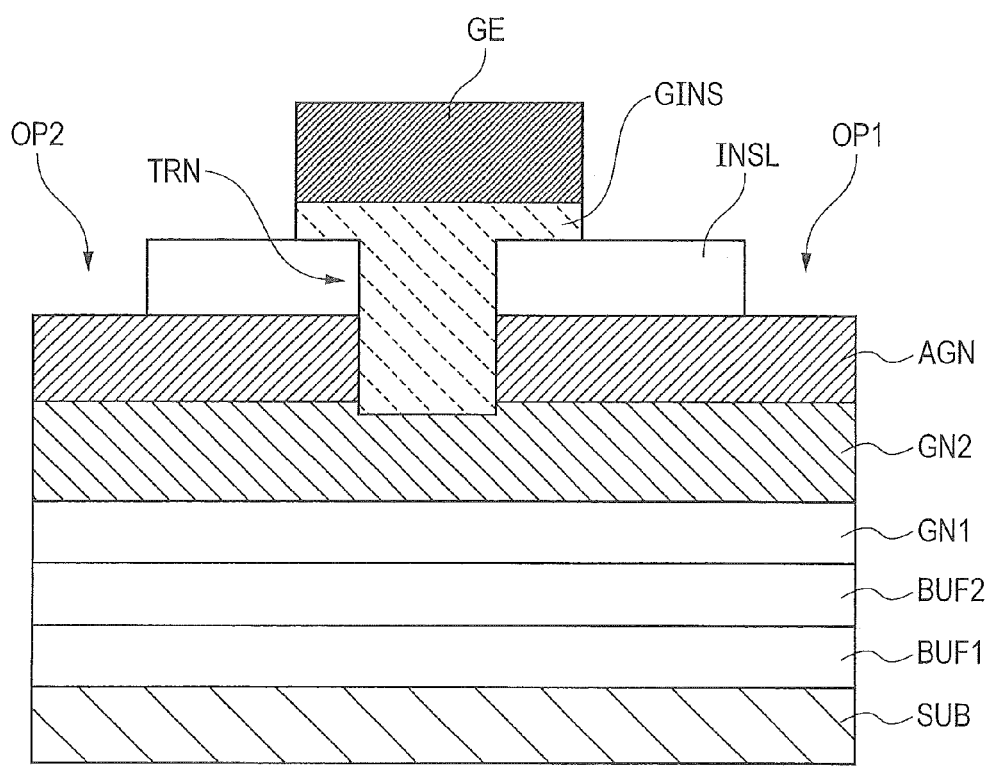
FIG. 4 is a diagram illustrating the exemplary method for manufacturing the semiconductor device.

Subsequently, as illustrated in FIG. 4, a resist pattern (not shown) is formed on the insulating layer INSL, and the insulating layer INSL is etched with the resist pattern as a mask. As a result, openings OP1 and OP2 are formed in areas of the insulating layer INSL where the respective Al electrodes DE and SE are formed. Thereafter, the resist pattern is removed.

Thereafter, an Al film is formed in the areas including interiors of the openings OP1 and OP2 through, for example, a vapor deposition technique or a sputtering technique. Then, a resist pattern (not shown) is formed on the Al film, and the Al film is etched with the resist pattern as a mask. With the above process, the Al electrodes DE and SE are formed. Then, the resist pattern is removed.

Thereafter, the AlGaN layer AGN, and the Al electrodes DE, SE are subjected to an annealing process. The annealing process is, for example, an RTA (rapid thermal anneal). A temperature in the annealing process is 450° C. or higher. Also, an upper limit of the temperature at this time is, for example, 600° C., preferably 550° C. When an upper limit value of this heat treatment is set to 550° C. or lower, if the gate insulating film GINS is made of $Al_2O_3$ (aluminum oxide film), the aluminum oxide film can be prevented from being recrystallized. Also, an annealing process time is, for example, 10 minutes or longer, preferably 30 minutes or longer. With the above process, even if a heat treatment temperature is 550° C. or lower, the connection between the Al electrodes DE, SE, and the AlGaN layer AGN can be performed by ohmic contact. For example, when the heat treatment temperature is 450° C., unless the heat treatment is conducted for 80 minutes or longer, it is difficult to uniformly realize a low contact resistance. Since it is preferable that the annealing process time is, for example, 80 minutes or shorter, the heat treatment temperature is preferably 470° C. or higher.

Grain diameters of the Al electrodes DE and SE become made larger by the annealing process. When viewed from a thickness direction of the Al electrodes DE and SE, crystal grains of the Al electrodes DE and SE have, for example, an area forming one layer.

Subsequently, the advantages of this embodiment will be described with reference to FIGS. 5 to 7. In an example illustrated in those drawings, none of the n-type impurity and the p-type impurity is added to the AlGaN layer AGN. Further, a thickness of the AlGaN layer AGN is 18 nm. Also, an interval between the Al electrode SE and the Al electrode DE is 2.6 μl. Also, a voltage between the Al electrode DE and the Al electrode SE is 1 V.

Figure 5:
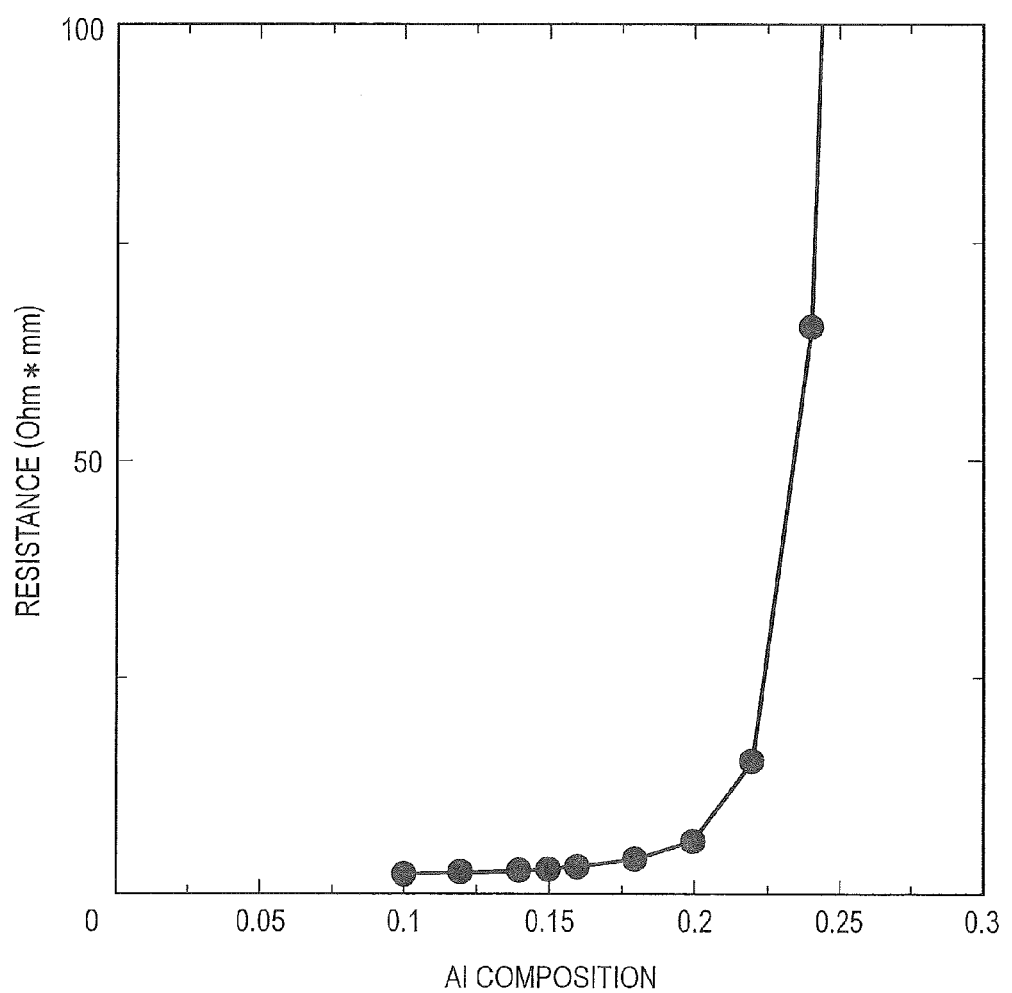
FIG. 5 is a diagram illustrating a relationship between a value (Al content) of x in an AlGaN layer, and a resistance between an Al electrode.

FIG. 5 is a diagram illustrating a relationship between a value (Al content) of x in the AlGaN layer AGN, and a resistance between the Al electrode DE and the Al electrode SE. The relationship in this drawing is obtained by simulation. It is found from this drawing that the contact resistance is rapidly lowered as x is decreased from 0.25. It is conceivable that the reason is because a potential barrier (Schottky barrier) generated from a difference between a work function of the Al electrode SE (or Al electrode DE) and a work function of the AlGaN layer AGN becomes smaller as x is lower, and a tunnel current that flows between the Al electrode SE (or Al electrode DE) and the AlGaN layer AGN rapidly increases. As x becomes 0.20 or lower, the contact resistance is sufficiently lowered. The contact resistance is sufficiently low in each of x=0.18, 0.16, 0.15, 0.12, and 0.10. For example, a sheet resistance between the Al electrode DE and the Al electrode SE becomes 1.0 Ω·mm or lower.

Therefore, in 0<x≤0.20, the Al electrodes DE and SE come in ohmic contact with the AlGaN layer AGN. It is conceivable that one of the reasons that the ohmic contact is performed when the concentration of the n-type impurity and the concentration of the p-type impurity are set to be lower in the AlGaN layer AGN is because scattering of electric charge by impurity ions is difficult to generate in the AlGaN layer AGN.

Also, it is conceivable that the concentration of the n-type impurity and the concentration of the p-type impurity are set to be higher in the AlGaN layer AGN to bring the Al electrodes DE and SE into ohmic contact with the AlGaN layer AGN. However, in this case, because a change in potential to be added to the drain electrode (Al electrode DE) is liable to be propagated into the AlGaN layer AGN, a withstand voltage of the transistor is lowered. On the contrary, in this embodiment, the concentration of the p-type impurity and the concentration of the n-type impurity in the AlGaN layer AGN are each $1\times10^{16}$ $cm^{-3}$ or lower. Therefore, a withstand voltage of the transistor is also high.

Figure 6:
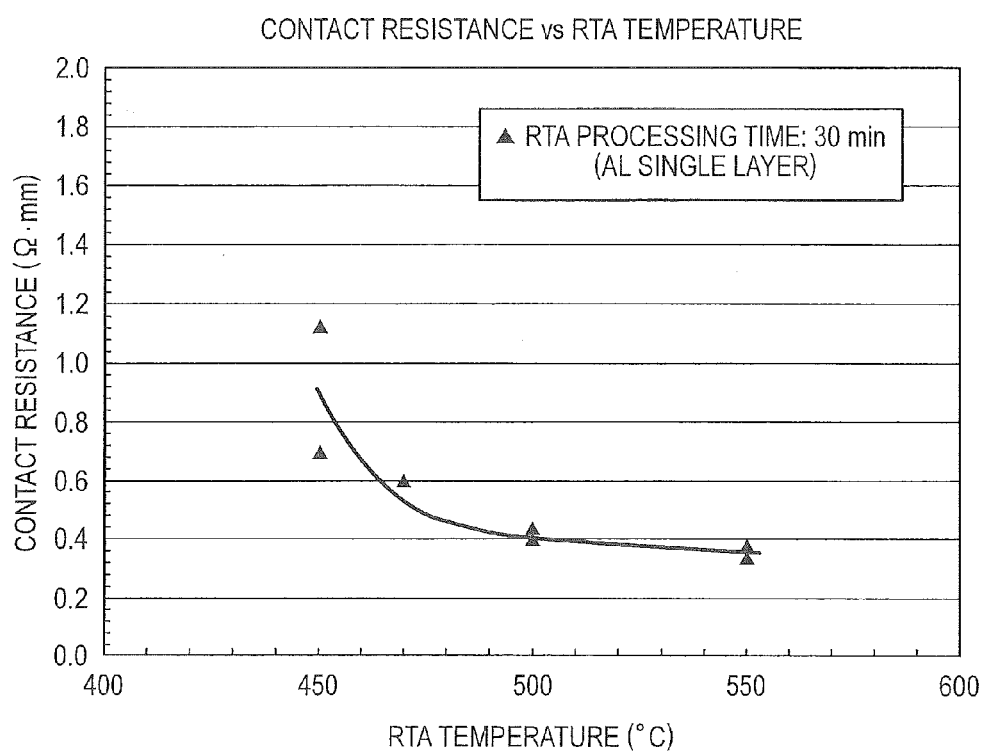
FIG. 6 is a diagram illustrating a relationship between a resistance between the Al electrodes, and a heat treatment temperature.
Figure 7:
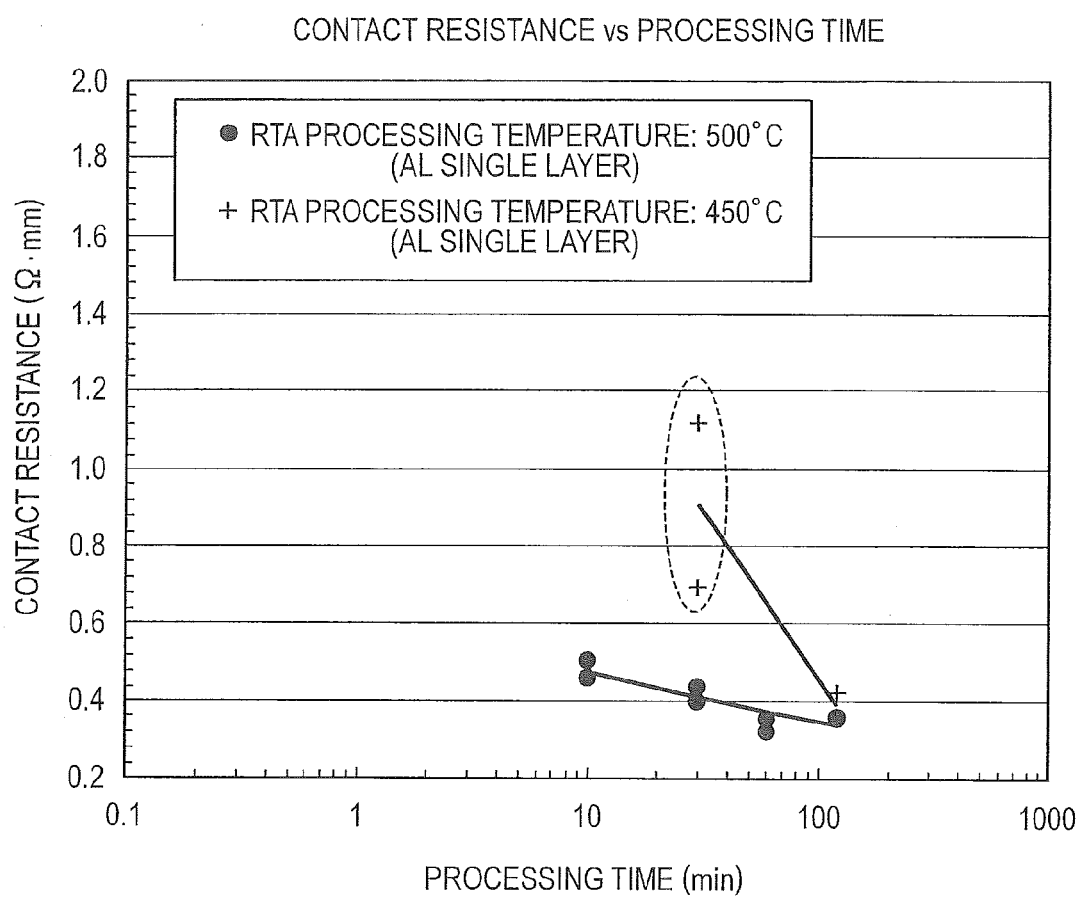
FIG. 7 is a diagram illustrating a relationship between a resistance between the Al electrodes, and a heat treatment time.

FIG. 6 is a diagram illustrating a relationship between a resistance between the Al electrodes DE and SE, and a heat treatment temperature. The heat treatment time is 30 minutes. It is found from this drawing that when the heat treatment temperature is 470° C. or higher, the contact resistance is sufficiently lowered. Specifically, when the heat treatment temperature is 470° C., the sheet resistance between the Al electrode DE and the Al electrode SE is 0.6 Ω·mm, and when the heat treatment temperature is 500° C. or higher, the sheet resistance between the Al electrode DE and the Al electrode SE is 0.4 Ω·mm FIG. 7 is a diagram illustrating a relationship between the heat treatment time, and a resistance between the Al electrode DE and the Al electrode SE. When a processing temperature is 450° C., the contact resistance is not sufficiently low in the heat treatment time of 30 minutes. On the contrary, when a processing temperature is 500° C., the contact resistance is sufficiently low even in the heat treatment time of 10 minutes. It is found from this that when a processing temperature is 500° C. or higher, the contact resistance can be sufficiently lowered even if the heat treatment time is shorter.

The invention made by the present inventors has been described above in detail. However, the present invention is not limited to the above embodiments. It is needless to say that the present invention can be variously changed without departing from the spirit of the invention.

What is claimed is:

1. A semiconductor device, comprising:
   a nitride semiconductor layer comprising a GaN layer;
   an $Al_xGa_{(1-x)}N$ layer (where 0<x≤0.2) that is formed on the GaN layer, in the $Al_xGa_{(1-x)}N$ layer, both of a concentration of a p-type impurity and a concentration of an n-type impurity are $1\times10^{16}$ $cm^{-3}$ or lower;
   an Al electrode that is formed on the $Al_xGa_{(1-x)}N$ layer;
   a gate electrode formed above the $Al_xGa_{(1-x)}N$ layer, the gate electrode being electrically isolated from the $Al_xGa_{(1-x)}N$ layer;
   a gate insulating film disposed on a bottom surface of the gate electrode; and
   an insulating layer, separate from the gate insulating film, disposed on a bottom surface of the gate insulating film and on a surface of the $Al_xGa_{(1-x)}N$ layer,
   wherein another bottom surface of the gate insulating film is located below an upper surface of the GaN layer, and
   wherein a lowermost surface of the gate electrode is located above an upper surface of the insulating layer.

2. The semiconductor device according to claim 1, wherein the p-type impurity is not contained in the $Al_xGa_{(1-x)}N$ layer.

3. The semiconductor device according to claim 1, wherein the Al electrode comes in ohmic contact with the $Al_xGa_{(1-x)}N$ layer.

4. The semiconductor device according to claim 3, wherein the GaN layer comprises a channel layer,
wherein the $Al_xGa_{(1-x)}N$ layer comprises an electron supply layer,
wherein the Al electrode comprises at least one of a source electrode and a drain electrode,
wherein the gate insulating film comes in contact with the $Al_xGa_{(1-x)}N$ layer, and comprises aluminum oxide, and
wherein the gate electrode comes in contact with the gate insulating film.

5. The semiconductor device according to claim 1, wherein the Al electrode comprises at least one of Si, Ca, and Cu.

6. The semiconductor device according to claim 1, wherein the gate insulating film is disposed below the gate electrode to electrically isolate the gate electrode from the $Al_xGa_{(1-x)}N$ layer.

7. The semiconductor device according to claim 6, wherein the insulating layer is disposed on an upper surface of the $Al_xGa_{(1-x)}N$ layer.

8. The semiconductor device according to claim 7, wherein, on the upper surface of the $Al_xGa_{(1-x)}N$ layer, the insulating layer separates the gate insulating film from the Al electrode.

9. The semiconductor device according to claim 7, wherein, in a plan view, the insulating layer is located between the gate insulating film and the Al electrode.

10. The semiconductor device according to claim 6, wherein outer edges of the gate insulating film are spaced apart from the Al electrode.

11. The semiconductor device according to claim 6, wherein the gate insulating film penetrates into the GaN layer.

12. A semiconductor device, comprising:
a nitride semiconductor layer;
an $Al_xGa_{(1-x)}N$ layer (where $0<x\leq0.2$) formed on the nitride semiconductor layer;
an Al electrode formed on the $Al_xGa_{(1-x)}N$ layer;
a gate electrode formed on the $Al_xGa_{(1-x)}N$ layer, the gate electrode being electrically isolated from the $Al_xGa_{(1-x)}N$ layer;
a gate insulating film disposed on a bottom surface of the gate electrode; and
an insulating layer disposed on a bottom surface of the gate insulating film and on a surface of the $Al_xGa_{(1-x)}N$ layer, the insulating layer being separate from the gate insulating film,
wherein another bottom surface of the gate insulating film is located below an upper surface of the nitride semiconductor layer, and
wherein a lowermost surface of the gate electrode is located above an upper surface of the insulating layer.

13. The semiconductor device according to claim 12, wherein, in the $Al_xGa_{(1-x)}N$ layer, a concentration of a p-type impurity and a concentration of an n-type impurity are $1\times10^{16}$ cm$^{-3}$ or lower.

14. The semiconductor device according to claim 12, wherein the insulating layer is disposed on an upper surface of the $Al_xGa_{(1-x)}N$ layer, and
wherein, on the upper surface of the $Al_xGa_{(1-x)}N$ layer, the insulating layer separates the gate insulating film from the Al electrode.

15. The semiconductor device according to claim 14, wherein, in a plan view, the insulating layer is located between the gate insulating film and the Al electrode such that outer edges of the gate insulating film are spaced apart from the Al electrode.

16. The semiconductor device according to claim 14, wherein the gate insulating film penetrates into the nitride semiconductor layer.

* * * * *